United States Patent [19]
Tokita et al.

[11] Patent Number: 5,732,465
[45] Date of Patent: Mar. 31, 1998

[54] METHOD OF MANUFACTURING ONE SIDE RESIN SEALING TYPE SEMICONDUCTOR DEVICES

[75] Inventors: Masakuni Tokita; Mitsutoshi Higashi, both of Nagano, Japan

[73] Assignee: Shinko Electric Industries Co., Ltd., Nagano, Japan

[21] Appl. No.: 502,811

[22] Filed: Jul. 14, 1995

[30] Foreign Application Priority Data

Jul. 15, 1994 [JP] Japan .................. 6-163631
Mar. 16, 1995 [JP] Japan .................. 7-056861

[51] Int. Cl.⁶ .................................................. H05K 3/30
[52] U.S. Cl. .................. 29/841; 29/832; 29/564.1; 206/707; 264/272.17
[58] Field of Search .................... 29/832, 840, 841, 29/564, 564.1; 264/272.17; 206/706, 707, 714, 716

[56] References Cited

U.S. PATENT DOCUMENTS

| | | | |
|---|---|---|---|
| 4,617,708 | 10/1986 | Fanning | 29/832 |
| 5,085,362 | 2/1992 | Art et al. | 29/840 |
| 5,119,934 | 6/1992 | Karasawa et al. | 206/716 |
| 5,218,759 | 6/1993 | Juskey et al. | 29/840 |
| 5,297,331 | 3/1994 | Childers | 29/832 |
| 5,309,322 | 5/1994 | Wagner et al. | 361/723 |
| 5,472,085 | 12/1995 | Gelzer | 206/714 |

FOREIGN PATENT DOCUMENTS

| | | |
|---|---|---|
| 0 424 530 A1 | 7/1989 | European Pat. Off. . |
| 0 564 865 A1 | 4/1992 | European Pat. Off. . |
| 62-160734 | 7/1987 | Japan . |
| 2-56940 | 2/1990 | Japan . |
| 2-129933 | 5/1990 | Japan . |
| 4-291737 | 10/1992 | Japan . |
| 5-47836 | 2/1993 | Japan . |
| 7-24273 | 3/1995 | Japan . |

OTHER PUBLICATIONS

Patent Abstracts Of Japan, vol. 015 No. 108 (E-1045), 14 Mar. 1991, & JP-A-03 001560 (Oki Electric Ind Co Ltd) 8 Jan. 1991.

*Primary Examiner*—P. W. Echols
*Attorney, Agent, or Firm*—Pennie & Edmonds LLP

[57] ABSTRACT

A one side resin sealing type semiconductor device has a semiconductor element which is mounted on one side of a circuit board. Wiring patterns are provided on both sides of the circuit board. The semiconductor element mount portion is sealed with resin. External connecting terminals, such as soldering balls, are joined to the wiring pattern on the other side of the circuit board. The method of manufacturing one side resin sealing type semiconductor devices includes the steps of: positioning and disposing the circuit board formed into an individual piece corresponding to a through-hole formed in a rectangular carrier frame; and conveying the circuit board supported by the carrier frame so as to conduct a series of processing steps such as mounting the semiconductor element, electrically connecting the semiconductor element with the wiring pattern, sealing the semiconductor element mount portion with resin, and connecting the wiring pattern with the external connecting terminals.

21 Claims, 10 Drawing Sheets

METHOD OF MANUFACTURING ONE SIDE RESIN SEALING TYPE SEMICONDUCTOR DEVICES

BACKGROUND OF THE INVENTION

1. Field of the Invention

The present invention relates to a method for manufacturing a one side resin sealing type semiconductor device in which a circuit board such as a BGA (Ball Grid Array) is used, and also relates to a carrier frame used for manufacturing such a one side resin sealing type semiconductor device.

2. Description of Related Art

An over molded BGA type semiconductor device is manufactured in such a manner that a semiconductor element is mounted on a printed board, and one of the surfaces of the printed board on which the semiconductor element is mounted is sealed with resin, and then solder balls are attached onto the other surface of the board. According to the method of manufacturing a BGA type semiconductor device of the prior art, a printed board of a large size, on both surfaces of which the predetermined wiring patterns are provided (these wiring patterns on the both surfaces being connected by through-hole patterns), is cut into several rectangular pieces, and each of the thus obtained rectangular printed boards 5 is conveyed to the processes of mounting a semiconductor element, bonding wires, sealing with resin and attaching solder balls. In this way, the product of the semiconductor device is manufactured.

The above-mentioned method in which the rectangular printed board is conveyed to each process for manufacturing BGA type semiconductor device is advantageous, because it is possible to utilize a common manufacturing apparatus of semiconductor devices in which a lead frame is used. However, when a rectangular printed board is used, a problem may be encountered, in which a large part of the printed board must be wasted.

In the case where a plurality of BGAs are manufactured using a rectangular printed board, the semiconductor elements are mounted on one of the surfaces of the printed board and subjected to resin molding, and then external terminals such as solder balls are joined onto the other surface of the printed board. After that, the printed board is cut off to obtain several BGAs. Accordingly, the area of the printed board outside the cutting position is not used for the product of the semiconductor device, so that material of the periphery of the rectangular printed board is wasted. Besides, when the rectangular printed board is made of a printed board of a large size, it is necessary to provide a flap for cutting of the printed board. Therefore, material of the printed board corresponding to the flap for cutting is wasted in the process of making the printed board.

In order to avoid the aforementioned waste of material of the printed board, the following method may be adopted. The base board is individually formed, being separated into each piece of the product size, and each piece is conveyed one by one so that a semiconductor element is mounted on each base board and then each base board is subjected to resin molding. However, it takes time and labor to handle a printed board that has been divided into individual pieces. Further, it is impossible to utilize a common semiconductor manufacturing apparatus in which a lead frame is utilized.

SUMMARY OF THE INVENTION

It is an object of the present invention to provide a method for manufacturing one side resin sealing type semiconductor devices in which the manufacturing cost of a printed board can be reduced and the existing apparatus can be effectively used for mounting the semiconductor element and sealing the printed board with resin, and also to provide a carrier frame used for manufacturing such one side resin sealing type semiconductor devices.

It is another object to solve the above problems.

A method of manufacturing one side resin sealing type semiconductor devices of the present invention is characterized in that: a circuit board, the size of which is formed into an individual piece of the product, is disposed in a carrier frame having a predetermined through-hole shape in such a manner that the circuit board is opposed to the through-hole; and the circuit board is conveyed to each process by each carrier frame, so that the processes of mounting a semiconductor element, wire bonding and resin sealing are effected. On the circuit board, there is provided a wiring pattern for joining the semiconductor mount face to the external terminals, and it is possible to mount a semiconductor element, to bond wires, to seal the circuit board with resin, and to join the external terminals under the condition that the circuit board is supported by the carrier frame.

The carrier frame is formed into a rectangle so that a plurality of individual pieces of circuit boards can be supported by the carrier frame, and the individual circuit boards are positioned and supported by the support means so that they can be positioned in the carrier frame. When the circuit board is engaged with the carrier frame by an engaging piece and engaging portion, the circuit board is conveyed while the carrier frame is reversed.

According to the method of manufacturing one side resin sealing type semiconductor devices of the present invention, as described above, it is possible to effectively reduce the manufacturing cost of the one side resin sealing type semiconductor device. When the circuit board is conveyed while it is supported by the carrier frame, the existing apparatus can be used for the effective manufacture of the one side resin sealing type semiconductor device. According to the carrier frame of the present invention, it is possible to preferably manufacture the one side resin sealing type semiconductor device.

DETAILED DESCRIPTION OF THE PREFERRED EMBODIMENTS

Figure 1A:
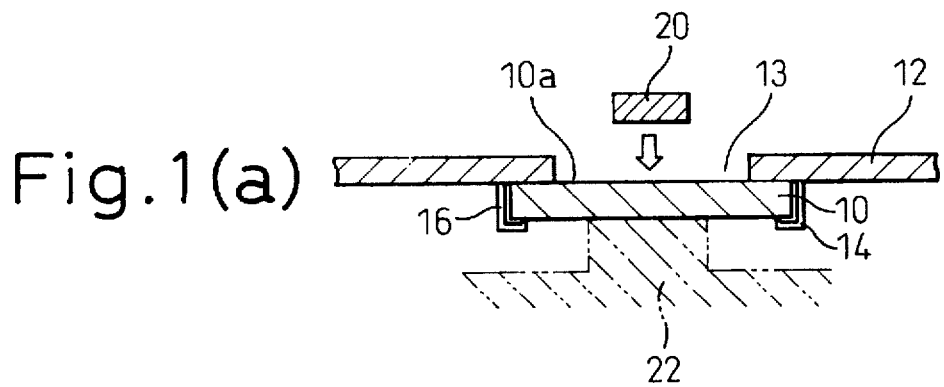
FIGS. 1(a) to 1(d) are schematic illustrations for explaining the method of manufacturing one side resin sealing type semiconductor devices.

With reference to the accompanying drawings, preferred embodiments of the present invention will be explained in detail as follows.

FIGS. 1(a) to 1(d) are views showing a series of assembly processes of BGA type semiconductor devices, which is an embodiment of the method of manufacturing one side resin sealing type semiconductor devices. A semiconductor element 20 is mounted on a circuit board 10, which is a body of a BGA, and the circuit board 10 is subjected to resin sealing after wire bonding, and then solder balls 30 are joined to the circuit board 10. In this embodiment, individual pieces of circuit boards 10, the sizes of which are the same as those of the products, are used, and a plurality of such circuit boards 10 are disposed in a carrier frame 12, and the individual carrier frame 12 is conveyed to each process so that the circuit board 10 is subjected to the predetermined processing. In this case, the carrier frame 12 is made of a metal, such as iron, or heat-resistant resin.

One side of the circuit board 10 is a semiconductor element mount face 10a. On the semiconductor element mount face 10a, there is provided a wiring pattern which is subjected to wire bonding with a mounted semiconductor element. On the other side of the circuit board 10, there is provided a wiring pattern to which external terminals are joined. In a portion of the carrier frame 12 where the circuit board 10 is disposed, there is provided a through-hole 13 used for processing so that the predetermined processing can be conducted under the condition that the circuit board 10 is attached to the carrier frame 12.

It is possible to process the circuit board 10 either when the circuit board 10 is attached onto an upper side of the carrier frame 12 or when the circuit board 10 is attached onto a lower side of the carrier frame 12. In the example shown in FIG. 1, the circuit board 10 is supported on the lower face of the carrier frame 12. In this case, the circuit board 10 is attached to the carrier frame 12 while the semiconductor element mount face 10a comes into contact with the carrier frame 12.

Figure 4:
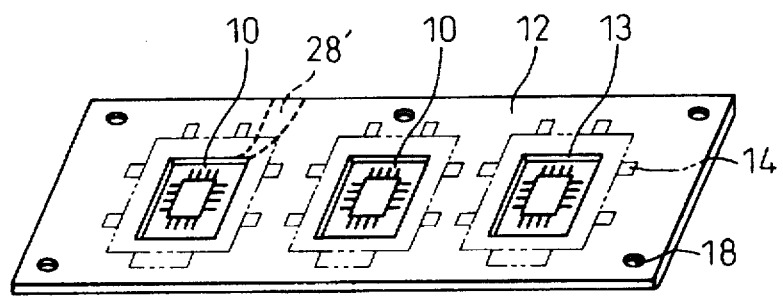
FIG. 4 is a schematic perspective view showing a state in which a plurality of circuit boards are attached to the carrier frame.

FIG. 4 shows a state in which a plurality of above-mentioned circuit boards 10 are supported by the carrier frame 12. In this example, three sheets of circuit boards 10 are supported by a single carrier frame 12, and rectangular through-holes 13 are formed at positions of the carrier frame 12 where the circuit boards 10 are disposed. In this embodiment, the through-holes 13 are provided for mounting the semiconductor elements 20 on the semiconductor element mount face 10a of the circuit board 10 so that the semiconductor elements 20 can be electrically connected with the wiring pattern by means of wire bonding. Further, the through-holes 13 are provided for defining resin seal regions into which resin is supplied when using resin sealing. Reference numeral 28' denotes a region to which a runner passage 28 is to be arranged.

Figure 5:
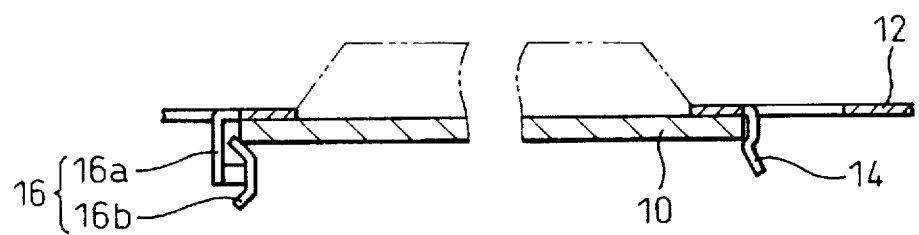
FIG. 5 is a schematic cross-sectional view showing a support means for supporting the circuit board by the carrier frame.
Figure 6:
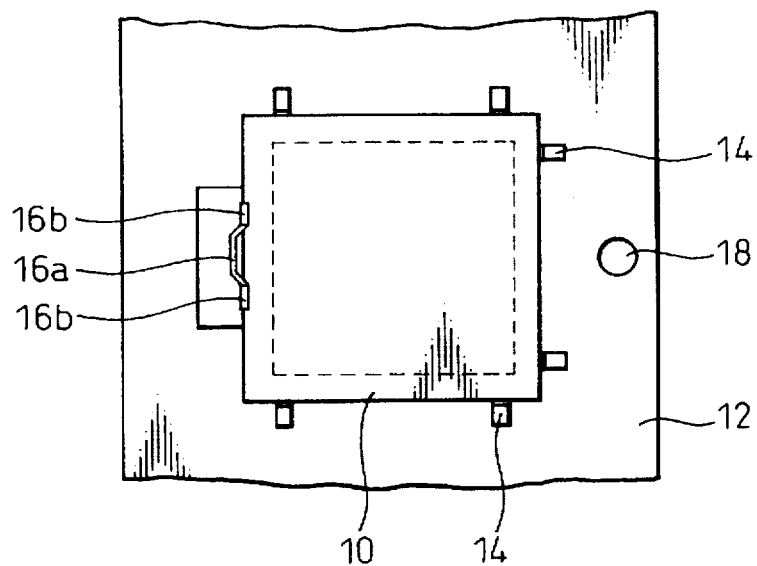
FIG. 6 is a schematic plan view showing the support means for supporting the circuit board.

FIG. 5 is a schematic illustration to explain a support means for positioning and supporting the circuit board 10 by the carrier frame 12. FIG. 6 is a schematic illustration for explaining a plan arrangement of the support means. As illustrated in FIG. 6, in this embodiment, the carrier frame 12 includes: engaging pieces 14 which are a support means for supporting three sides of the circuit board 10; and an engaging portion 16 for supporting the remaining one side of the circuit board 10. As illustrated in FIG. 5, the engaging piece 14 is made in such a manner that a portion of the sheet member composing the carrier frame 12 is cut and raised, and a fore end of the engaging piece 14 is open outwardly so that the circuit board 10 can easily be arranged, and further a middle portion of the engaging piece 14 is a little constricted in accordance with the thickness of the circuit board 10, so that the circuit board 10 can be easily engaged with the carrier frame 12. The circuit board 10 is engaged with the engaging piece 14 and positioned in the carrier frame 12 by the engaging piece 14.

In the same manner as the engaging piece 14, the engaging portion 16 is made in such a manner that a portion of the sheet member composing the carrier frame 12 is cut and raised. The engaging portion 16 includes a rising piece portion 16a at which the sheet member is cut and raised, and a pair of pressing piece portions 16b provided at the free end of the rising piece portion 16a. The pressing piece portions 16b support the circuit board 10 by pressing the circuit board 10 against the carrier frame 12. As illustrated in FIG. 6, the pressing piece portions 16b are disposed on the respective sides of the rising piece portion 16a. A side of the pressing piece portion 16b where the circuit board 10 is pressed is curved outwardly in an inclined condition so that the circuit board 10 can be easily attached to and detached from the carrier frame 12.

In this connection, reference numeral 18 is a pilot hole used when the carrier frame 12 is fed by a predetermined distance in the processing, further the pilot hole 18 is used for positioning the carrier frame 12 in the apparatus.

Next, the manufacturing process shown in FIGS. 1(a) to 1(d) is explained as follows. In FIG. 1(a), the circuit board 10 is positioned in the carrier frame 12 by the support means described above while the semiconductor element mount face 10a of the circuit board 10 comes into contact with the carrier frame 12, and the semiconductor element 20 is fixed onto the semiconductor element mount face 10a. In the above fixing process, a heater block 22 is made to contact a lower face of the circuit board 10, and the fixing portion is heated by the heater block 22 and joined by means of Au-Si eutectic joining or soldering. In this connection, the semiconductor element 20 may be fixed onto the circuit board 10 with thermo-setting resin at room temperature.

Figure 1B:
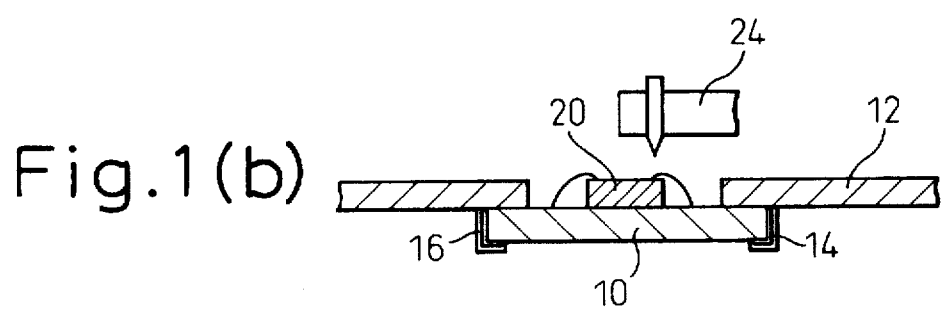

Next, as illustrated in FIG. 1(b), the semiconductor element 20 is electrically connected with the wiring pattern by means of wire bonding. Reference numeral 24 is a bonder used for wire bonding. In this connection, it should be noted that the electrical connection between the semiconductor element 20 and the wiring pattern on the circuit board 10 is not limited to the wire bonding, but other methods such as a gang bonding method or a flip chip bonding method may be adaptable.

Figure 1C:
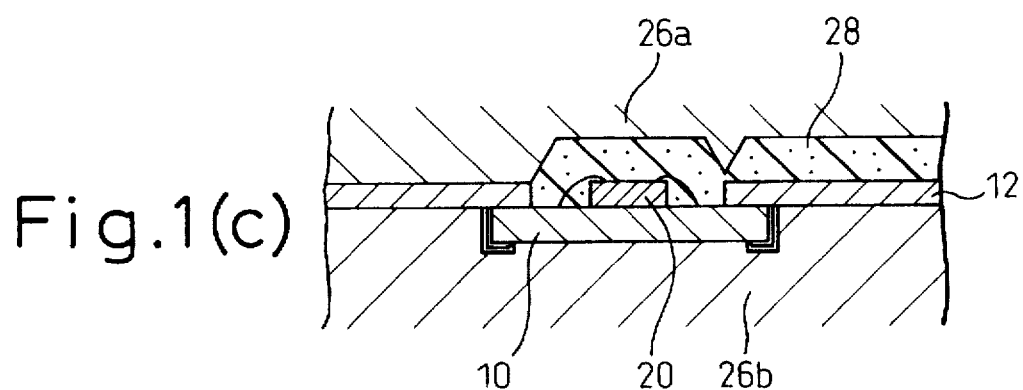

Next, in the resin sealing process, the semiconductor element 20 is sealed with resin. FIG. 1(c) shows a state in which the circuit board 10 and the carrier frame 12 are clamped by the metallic molds 26a and 26b, and the circuit board 10 is sealed with resin. Since the resin sealing operation is conducted on one side of the circuit board 10 on which the semiconductor element 20 is mounted, a cavity portion is formed in the metallic mold 26a on the upper side, and a runner passage 28 is provided on the upper face of the carrier frame 12 and the cavity portion is filled with resin. As illustrated in FIG. 1(c), when the circuit board 10 is clamped by the metallic mold 26a and resin is supplied, the cavity portion provided in the metallic mold 26a is filled with resin, and the through-hole 13 of the carrier frame 12, which corresponds to the thickness of the carrier frame 12, is also filled with resin.

In this connection, since the circuit board 10 is detached from the carrier frame 12 in the after-process (such as, after external connector terminals, i.e., solder balls 30, are attached), it is necessary to design the metallic mold 26a in such a manner that the resin formation region is not larger than the region of the through-hole 13. In this embodiment in which resin molding is conducted under the condition that the circuit board 10 is disposed on the lower side of the carrier frame 12, as illustrated in FIG. 1(c), only the runner passage 28 adheres to the carrier frame 12, and no resin adheres to the circuit board 10 when resin is molded for sealing.

Figure 1D:
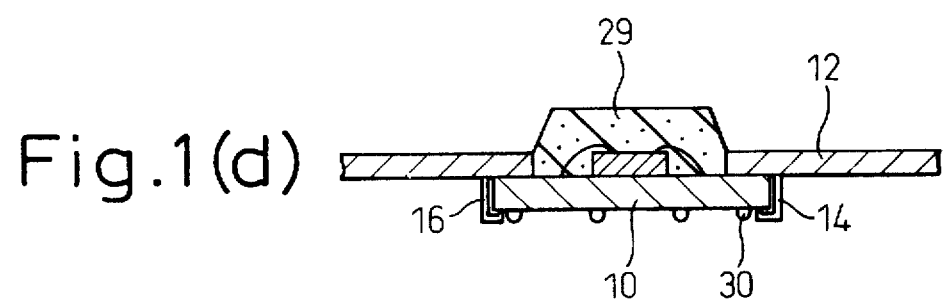

After the completion of resin sealing, as illustrated in FIG. 1(d), solder balls 30 used as the external terminals to be connected with an assembly board are attached onto the lower face of the circuit board 10. Since the circuit board 10 is only resiliently held by the carrier frame 12 through the support means, it is easy to detach the circuit board 10 from the carrier frame 12, and a single body of the BGA product can be provided. In this connection, reference numeral 29 is a resin sealing portion.

In the case of a BGA type semiconductor device, the solder balls are used as the external terminals, however, it is possible to use lead pins as the external terminals of the one side resin sealing type semiconductor device.

Figure 2:
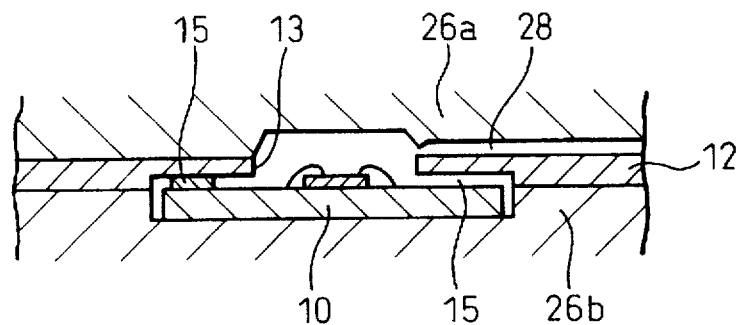
FIG. 2 is a schematic cross-sectional view for explaining the method of manufacturing one side resin sealing type semiconductor devices.
Figure 3:
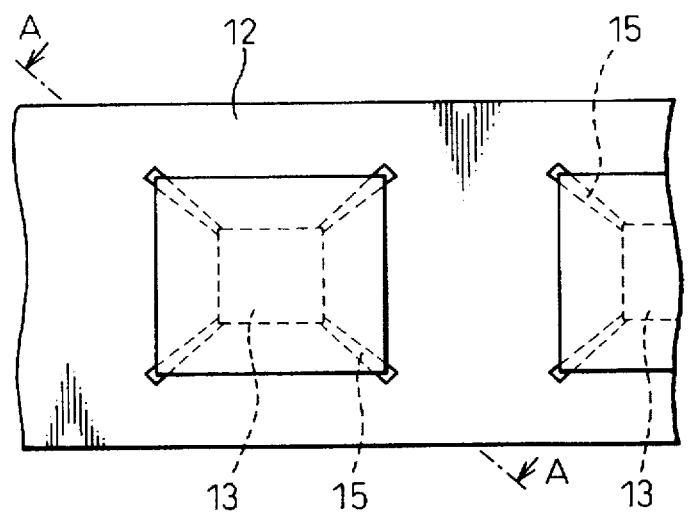
FIG. 3 is a schematic plan view showing a state in which the circuit board is attached to the carrier frame having a groove.

In general, a printed board is used for the circuit board 10 of the one side resin sealing type semiconductor device. In this case, the water-absorption and moisture-absorption properties of the printed board are higher than those of the ceramic package, and moisture tends to be absorbed from a side portion since the side of the circuit board 10 is exposed. In order to prevent moisture absorption, the following resin sealing method may be adopted: As illustrated in FIGS. 2 and 3, grooves 15 are formed on the face of the carrier frame 12 on which the circuit board 10 is supported, wherein the grooves 15 communicate the corners of the through-hole 13 with the periphery of the circuit board 10. The metallic mold 26b on the lower side is formed in such a manner that the size of a recess portion in which the circuit board 10 is set is a little larger than the outer size of the circuit board 10, so that resin flows from the grooves 15 into a clearance formed between the side wall of the recess portion of the metallic mold 26b and the side of the circuit board 10 when resin is supplied for sealing.

According to this resin sealing method, the overall side of the circuit board 10 is sealed with resin. Therefore, it is possible to prevent water and moisture from being absorbed from the side of the circuit board 10. In this connection, the grooves 15 formed in the carrier frame 12 are used to allow the supplied resin to flow onto the side of the circuit board 10. In this case, the circuit board 10 can be adhered to and held by the carrier frame 12 by means of an adhesive (not shown), in the same manner as the embodiment of FIG. 11. Accordingly, it is sufficient that the through-hole 13 is communicated with the periphery of the circuit board 10, and the positions of the grooves 15 are not limited to the corners of the through-hole 13, so that the positions of the grooves 15 can be appropriately determined. The number of the grooves 15 is not particularly limited. FIG. 2 is a cross-sectional view taken along line A—A in FIG. 3.

When a plurality of circuit boards 10 are supported by the carrier frame 12 so as to conduct a series of assembling processes, in the above embodiment, the carrier frame 12 is conveyed under the condition that the circuit boards 10 are set upwardly, however, depending upon the apparatus, it is preferable that the carrier frame 12 is reversed in the process.

Figure 7A:
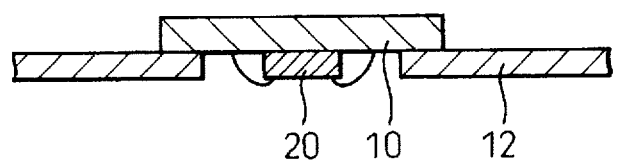
FIGS. 7(a) to 7(c) are schematic illustrations showing an embodiment of the method of manufacturing one side resin sealing type semiconductor devices.
Figure 7B:
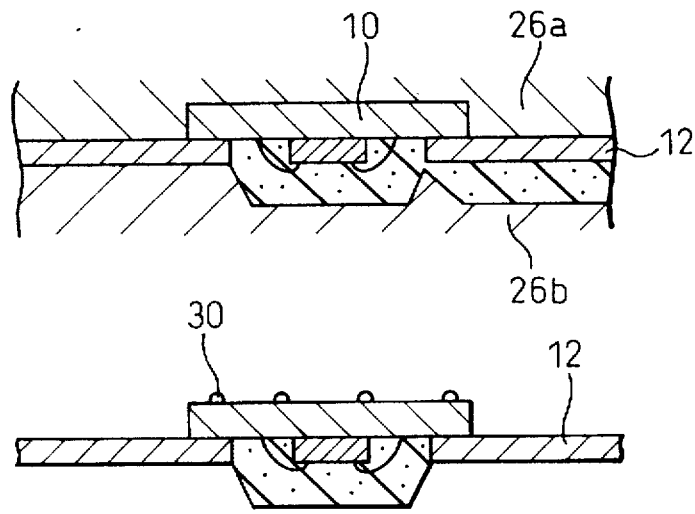
Figure 7C:
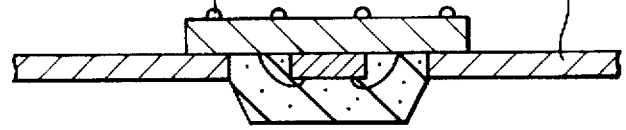

FIGS. 7(a) to 7(c) are views showing an embodiment in which the processing is conducted as follows. The semiconductor element 20 is mounted on the circuit board 10 and subjected to wire bonding. Then the carrier frame 12 is reversed, and the circuit board 10 is sealed with resin and the solder balls 30 are joined. In this embodiment, the circuit board 10 is located on the upper side of the carrier frame 12 in the case of resin sealing. Therefore, the circuit board 10 can be more positively supported, and further the solder balls 30 are joined on the upper side of the circuit board 10. Accordingly, it is easy to join the solder balls 30 onto the circuit board 10.

Figure 8A:
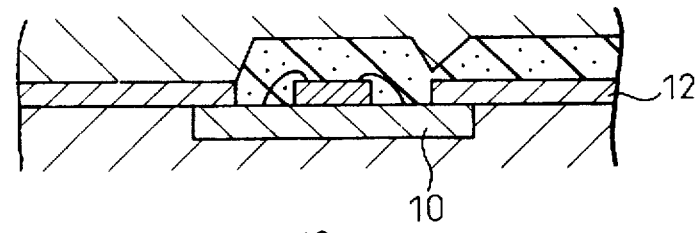
FIGS. 8(a) to 8(c) are schematic illustrations showing another embodiment of the method of manufacturing one side resin sealing type semiconductor devices.
Figure 8B:
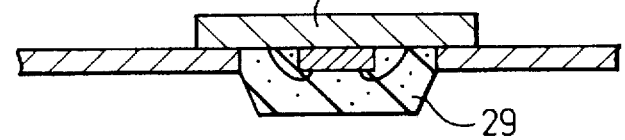
Figure 8C:
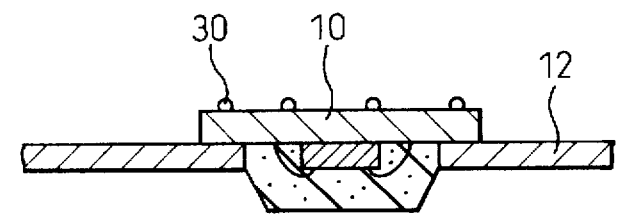

FIGS. 8(a) to 8(c) are views showing an embodiment in which the processes from the beginning to the resin sealing are conducted under the condition that the circuit board 10 is supported on the lower face of the carrier frame 12, and after the resin sealing has been completed, the carrier frame 12 is reversed and the solder balls 30 are joined.

In the above embodiment, the semiconductor element 20 is sealed with resin by means of resin molding in which the metallic molds 26a, 26b are used. However, sealing of the semiconductor element 20 is not necessarily limited to resin molding. For example, it is possible to use a resin coating method in which the sealing material is subjected to potting. In this case, it is necessary to set the semiconductor element mount portion of the circuit board 10 upwardly as illustrated in FIGS. 8(a) to 8(c) from the beginning of the process to the resin sealing.

In the embodiments shown in FIGS. 7(a) to 7(c) and FIG. 6, the carrier frame 12 is reversed only once during the processing, however, it is possible to further reverse the carrier frame 12. For example, in the embodiments shown in FIGS. 7 and 6, after the resin sealing has been completed, it is possible to reverse the carrier frame again so that the solder ball joining face is set downwardly and the solder balls 30 are joined.

Since the rectangular carrier frame 12 used in this embodiment engages with the circuit board 10 as illustrated in FIGS. 3 and 4, even when the carrier frame 12 reversed, no problems occur in the processing.

Figure 9:
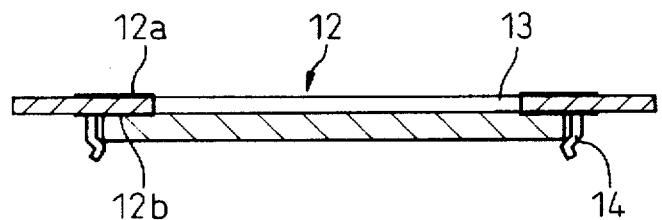
FIG. 9 is a cross-sectional view showing an embodiment of the carrier frame on which a resilient layer is provided.

The carrier frame 12 used in each embodiment described above supports the circuit board 10 in such a manner that the semiconductor element mount face 10a comes into contact with the carrier frame 12. FIG. 9 is a view showing another embodiment in which the circuit board 10 is supported in such a manner that the semiconductor element mount face 10a comes into contact with the carrier frame 12. The carrier frame 12 of this embodiment is characterized in that the resilient layers 12a, 12b are provided on both sides of the base material of the carrier frame 12.

Figure 10:
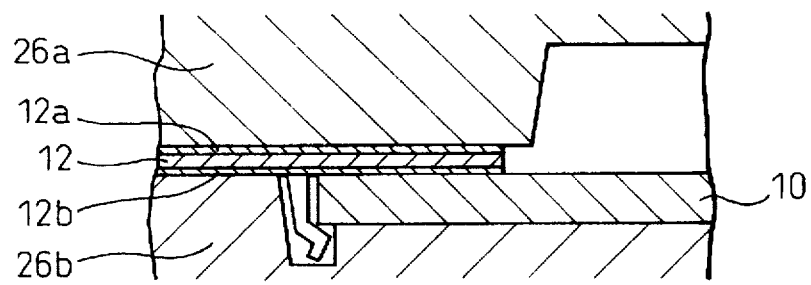
FIG. 10 is a partially enlarged cross-sectional view showing a state of resin sealing in which the circuit board is attached to the carrier frame provided with a resilient layer.

FIG. 10 is a view showing a state in which the circuit board 10 is attached to the carrier frame 12 provided with the resilient layers 12a and 12b, and the metallic molds 26a and 26b are clamped so as to seal the circuit board 10 with resin. The circuit board 10 is clamped together with the carrier frame 12 by the metallic molds 26a and 26b, and then sealed with resin. Since both sides of the carrier frame 12 of this embodiment are covered with the resilient layers 12a and 12b, the circuit board 10 can be appropriately clamped by the metallic molds 26a and 26b and sealed with resin.

When the circuit board 10 is clamped by the metallic molds 26a and 26b, the resilient layers 12a and 12b provided on both sides of the carrier frame 12 function in such a manner that the clamping force appropriately acts on the circuit board 10 so that resin can be prevented from leaking out from the resin sealing region. Due to the cushioning effect of the resilient layers 12a and 12b, it is possible to prevent the occurrence of damage such as cracks and dents of a resist layer provided on the surface of the circuit board 10 when the circuit board 10 is strongly clamped by the metallic molds 26a and 26b through the carrier frame 12.

The material of the resilient layers 12a and 12b is not particularly limited, but a resilient material such as heat resistant silicon may be appropriately used. In this embodiment, the resilient layers 12a and 12b are provided on both sides of the base material of the carrier frame 12, however, when the resilient layers 12a and 12b are provided at least on the faces of the carrier frame 12 with which the circuit board 10 comes into contact, it is possible to prevent the occurrence of leakage of resin and damage of the resist layer of the wiring pattern. Also, the resilient layers 12a and 12b may be provided over the entire surface of the carrier frame 12. Alternatively the resilient layers 12a and 12b may be provided only in a portion where the circuit board 10 comes into contact with the metallic mold 26a as illustrated in FIG. 9.

Figure 11:
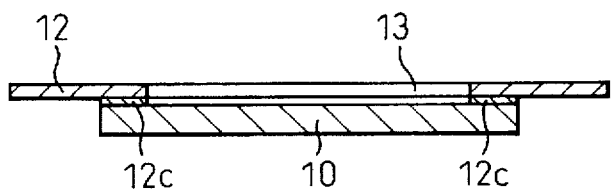
FIG. 11 is a cross-sectional view showing a state in which the circuit board is attached to the carrier frame provided with an adhesive layer.

FIG. 11 is a view showing still another embodiment of the carrier frame 12. This embodiment is characterized in that: an adhesive layer 12c is provided in the periphery of the through-hole 13 on the carrier frame 12 where the circuit board 10 is supported, and the circuit board 10 adheres to the carrier frame 12 and is supported. In the carrier frame 12 shown in FIG. 5, the circuit board 10 is supported by the engaging pieces 14. However, according to the method of this embodiment in which the adhesive layer 12c is provided, the circuit board 10 can be simply supported, and further when the carrier frame 12 is manufactured, it is not necessary to cut and raise the engaging pieces 14, so that the carrier frame 12 can be easily made. Furthermore, this embodiment is advantageous in that the adhesive layer 12c has the same cushioning effect as that of the resilient layers 12a and 12b of the above embodiment.

The adhesive layer 12c may be formed in such a manner that an adhesive agent is coated on the face of the carrier frame 12, or an adhesive film is adhered onto the face of the carrier frame 12. Examples of usable adhesive films are: an ultraviolet ray hardening film, and a track dry epoxy film. Since the circuit board 10 is separated from the carrier frame 12 after the completion of assembly, it is preferable that the adhesive layer 12c has a feature in which the circuit board 12 can be easily detached from the adhesive layer 12c after the completion of assembly.

Next, there is shown an embodiment in which the circuit board 10 is supported on the upper face of the carrier frame 12 and subjected to the necessary assembly process. In each embodiment described above, the circuit board 10 is attached in such a manner that the semiconductor element mount face comes into contact with the carrier frame 12 and then the circuit board 10 is subjected to resin sealing. However, in the following embodiment, the circuit board 10 is supported in such a manner that a joining face onto which the solder balls 30 are joined is contacted with the carrier frame 12.

Figure 12:
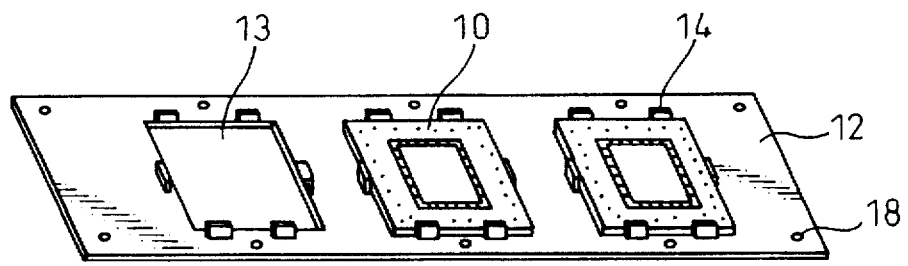
FIG. 12 is a schematic perspective view showing a state in which the circuit boards are attached to the carrier frame.

FIG. 12 is a view showing a state in which the circuit board 10 is attached onto the upper face of the carrier frame 12. In the same manner as that of the embodiment described before, the through-hole 13 is formed in the carrier frame 12, and the circuit board 10 is positioned by the engaging pieces 14.

Figure 13:
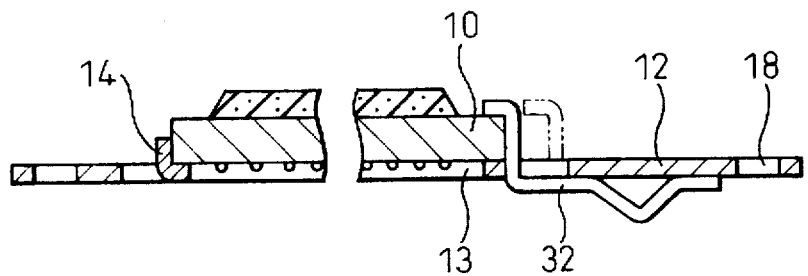
FIGS. 13, 14 and 15 are schematic cross-sectional views showing support means for supporting the circuit board by the carrier frame.
Figure 14:
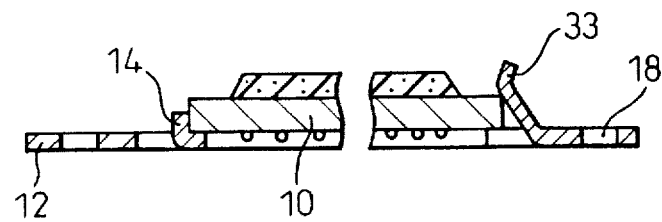
Figure 15:
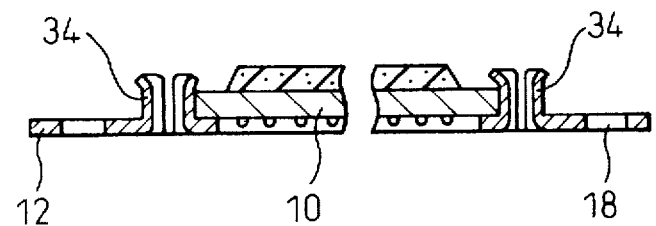

FIGS. 13, 14 and 15 show the other embodiments in which the circuit board 10 is supported on the upper face of the rectangular carrier frame 12.

The embodiment shown in FIG. 13 is composed as follows. A sheet member composing the carrier frame 12 is cut and raised so as to form the engaging piece 14. When this engaging piece 14 comes into contact with the side of the circuit board 10, the circuit board 10 can be positioned with respect to the tarrier frame 12. A resilient movable engaging piece 32 composed differently from the carrier frame 12 is fixed to the lower face of the carrier frame 12 by means of soldering, and the circuit board 10 is held being pressed against the carrier frame 12 by the movable engaging piece 32.

When the circuit board 10 is attached to and detached from the carrier frame 12, the movable engaging piece 32 is pushed open. Since the carrier frame 12 is composed differently from the movable engaging piece 32, the number of parts is increased, however, the circuit board 10 can be positively supported by the resilient movable engaging piece 32.

The embodiment shown in FIG. 14 is composed as follows. A movable engaging piece 33 pressing the circuit board 10 against the carrier frame 12 is made when a sheet member composing the carrier frame 12 is cut and raised relatively long, and an inner face of the movable engaging piece 33 presses an upper edge of the side of the circuit board 10, so that the circuit board 10 is supported by the carrier frame 12. When an upper edge of the movable engaging piece 33 is curved so as to be open outwardly, the movable engaging piece 33 can be easily pushed open, and the circuit board 10 can be easily attached to and detached from the carrier frame 12. Since the movable engaging piece 33 is composed integrally with the carrier frame 12 in this embodiment, it is advantageous that the structure of the carrier frame 12 is simplified.

The embodiment shown in FIG. 15 is composed as follows. A sheet member composing the carrier frame 12 is subjected to burring in order to engage the circuit board 10 with the carrier frame 12, and engaging pins 34 are attached at the engaging positions of the circuit board 10. In this case, the engaging pins 34 are provided with slits, so that they can be resilient. An upper edge of the engaging pin 34 is open outwardly. When the circuit board 10 is set, the side of the circuit board 10 is engaged with the side of the engaging pin 34, so that the circuit board 10 is pressed against the carrier frame 12.

FIGS. 16(a) to 16(d) are views showing an assembling process in which the carrier frame 12 shown in FIG. 12 is attached to the circuit board 10 and assembled. After the circuit board 10 has been put onto the carrier frame 12 (FIG. 16(a)), the semiconductor element 20 is mounted on the semiconductor mount face 10a of the circuit board 10 and electrically connected with the wiring pattern on the circuit board 10 by means of wire bonding (FIG. 16(b)).

Figure 16A:
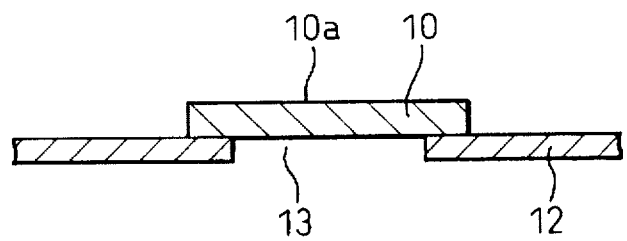
FIGS. 16(a) to 16(d) are schematic illustrations showing an embodiment of the method of manufacturing one type of side resin sealing type semiconductor devices.
Figure 16B:
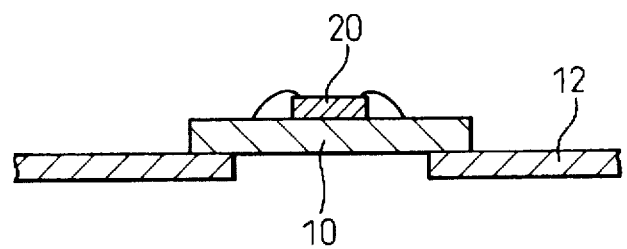
Figure 16C:
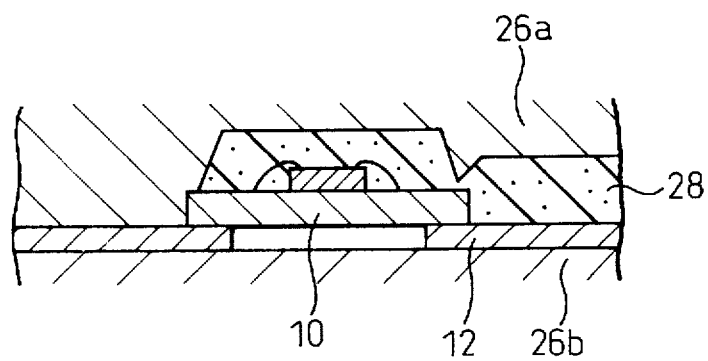

Then the circuit board 10 and the carrier frame 12 are clamped with each other by the metallic molds 26a and 26b, and sealed with resin (FIG. 16(c)). In this resin sealing operation, the metallic mold 26a directly comes into contact with the circuit board 10, and resin is contacted with the side of the circuit board 10 when the resin flows into the cavity from the runner passage 28.

Figure 16D:
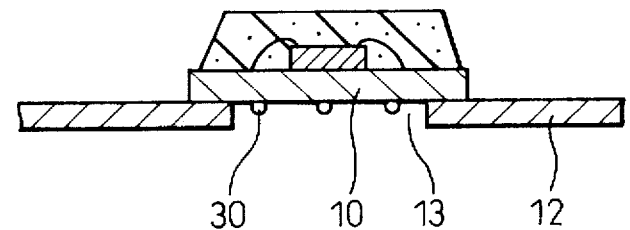

As illustrated in FIG. 16(d), after the completion of resin sealing, solder balls 30 are joined onto the lower face of the circuit board 10. When the circuit board 10 is removed from the carrier frame 12, a single product can be provided. When the circuit board 10 is conveyed also in this embodiment while the circuit board 10 is attached to the carrier frame 12 in which the through-hole 13 is formed, the predetermined assembling process can be effectively carried out. In this connection, in the manufacturing process shown in FIGS. 16(a) to 16(d), the support means provided in the carrier frame 12 may be composed of pins for positioning by which the circuit board 10 can be positioned in the carrier frame 12.

Figure 17A:
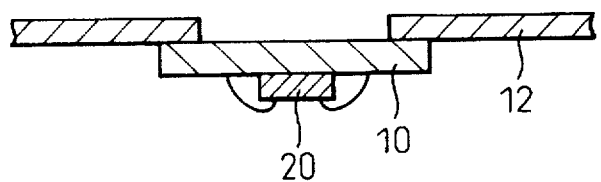
FIGS. 17(a) to 17(c) are schematic illustrations showing an embodiment of the method of manufacturing one type of side resin sealing type semiconductor devices.
Figure 17B:
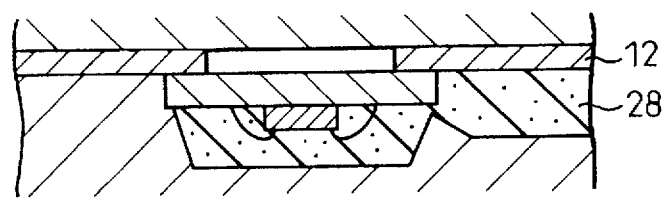
Figure 17C:
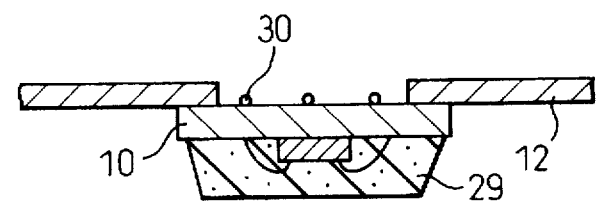

FIGS. 17(a) to 17(c) are views showing another embodiment in which the assembling process is carried out under the condition that the joining face of solder balls is contacted with the carrier frame 12 so that the circuit board 10 is supported by the carrier frame 12. In this embodiment, after the semiconductor element 20 has been mounted on the circuit board 10 and subjected to wire bonding, the semiconductor element 20 is sealed with resin under the condition that the carrier frame 12 is reversed (FIG. 17(b)). Then the solder balls 30 are joined (FIG. 17(c)). In this way, the product is provided.

Figure 18A:
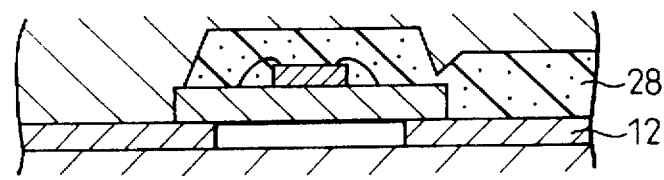
FIGS. 18(a) to 18(c) are schematic illustrations showing another embodiment of the method of manufacturing one type of side resin sealing type semiconductor devices.
Figure 18B:
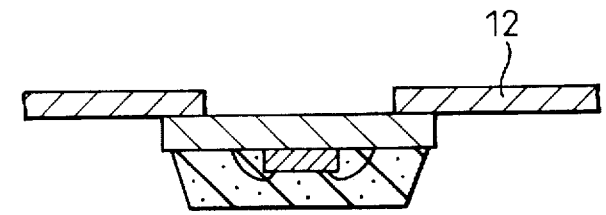
Figure 18C:
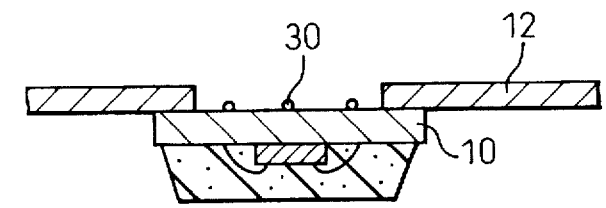

FIGS. 18(a) to 18(c) are views showing still another embodiment. In this embodiment, after resin sealing has been completed under the condition that the circuit board 10 is put on the carrier frame 12 (FIG. 18(a)), the carrier frame 12 is reversed (FIG. 18(b)) and the solder balls 30 are joined (FIG. 18(c)).

In the embodiment shown in FIGS. 16(a) to 16(d), 17(a) to 17(c) and 18(a) to 18(c), in the same manner as that of the embodiment described before, instead of resin molding in which the metallic molds 26a and 26b are used, the semiconductor element 20 may be sealed with resin by means of resin coating such as potting. In these embodiments, the solder balls 30 are used as the external terminals, however, it is possible to utilize lead pins as the external terminals.

In the above embodiments, a plurality of through-holes 13 are formed in the carrier frame 12, however, it is possible to apply the present invention to a case in which one circuit board 10 is attached to one carrier frame 12, and it is also possible to apply the present invention to a case in which a plurality of rows of through-holes 13 are formed in the carrier frame in the longitudinal and transverse directions so that a plurality of rows of circuit boards 10 can be attached to the carrier frame.

Figure 19:
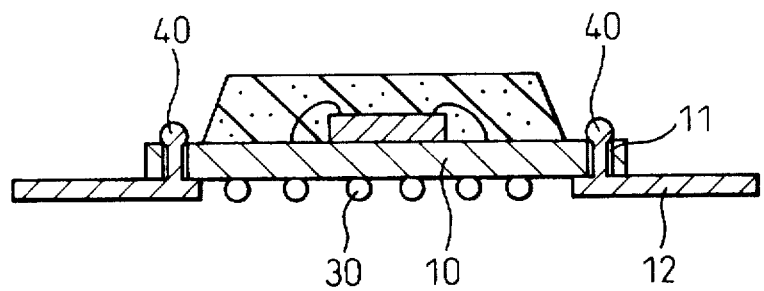
FIGS. 19 and 20 are cross-sectional views showing a state of resin sealing in which the circuit board is attached to the carrier frame having fixing pins.
Figure 20:
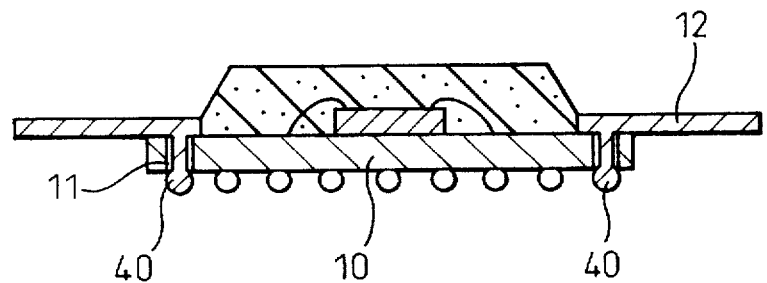
Figure 21:
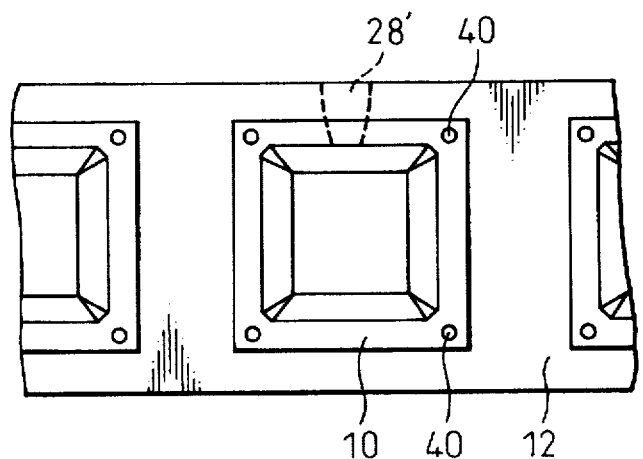
FIG. 21 is a plan view showing a state in which the circuit boards are attached to the carrier frame.

FIGS. 19 and 20 are views showing still another embodiment of the carrier frame 12 to which the circuit board 10 is attached. These embodiments are characterized in that: fixing pins 40 protruding from the carrier frame 12 are inserted into the through-holes 11 disposed outside the resin sealing region on the circuit board 10. FIG. 21 is a plan view showing a state in which the circuit board 10 is attached to the carrier frame 12. In this embodiment, through-holes 11 are provided in the 4 corners of the circuit board 10, and a fixing pin 40 is inserted into each through-hole 11 so that the circuit board 10 can be fixed. Reference numeral 28' denote a region to which a runner passage is to be arranged.

FIG. 19 shows a state in which the circuit board 10 is attached onto an upper face of the carrier frame 12 and sealed with resin, and FIG. 20 shows a state in which the circuit board 10 is attached onto a lower face of the carrier frame 12 and sealed with resin. In any case, an end of the fixing pin 40 is formed into a sphere, the diameter of which is larger than the inner diameter of the through-hole 11, so that the circuit board 10 can be positively fixed to the carrier frame 12 when the fixing pin 40 is inserted into the through-hole 11.

Figure 22A:
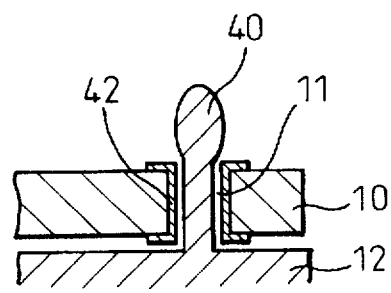
FIGS. 22(a) and 22(b) are schematic cross-sectional views showing other examples of the fixing pins formed on the carrier frame.
Figure 22B:
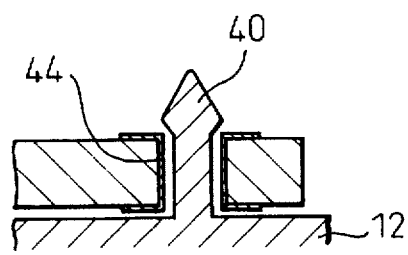
Figure 23:
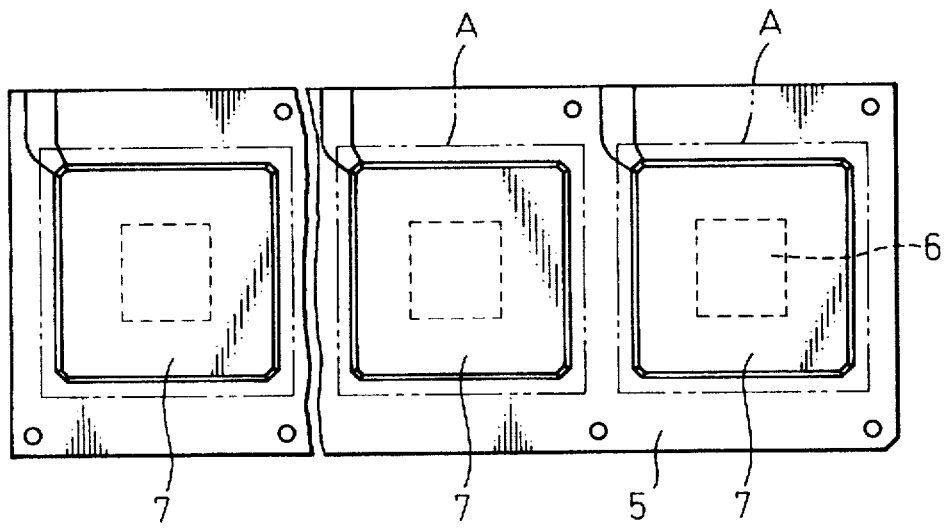
FIG. 23 is a plan view of a one side resin sealing type semiconductor device.

FIGS. 22(a) and 22(b) are views showing the other shapes of the fixing pin 40 provided in the carrier frame 12. In FIG. 22(a), a protruding end of the fixing pin 40 is formed to be elliptical. In FIG. 22(b), a fore end of the fixing pin 40 is formed to be conical (the section is lozenge-shaped). FIG. 22(a) shows an embodiment in which the inside of the through-hole 11 is subjected to plating 42, and FIG. 22(b) shows an embodiment in which the inside of the through-hole 11 is subjected to fluororesin coating 44. When the inside of the through-hole 11 is processed in this way, the through-hole 11 is not damaged when the fixing pin 40 is inserted into or pulled out from it.

Compared with the embodiment shown in FIG. 5 in which the side edge of the circuit board 10 is engaged with the engaging pieces 14 and the engaging portions 16 so that the circuit board 10 can be fixed, this embodiment, in which the circuit board 10 is fixed by the fixing pins 40 provided in the carrier frame 12, is advantageous in that the positioning accuracy of the circuit board 10 can be enhanced and the circuit board 10 can be positively fixed, and further the side edge of the circuit board 10 is not damaged when it is attached to the carrier frame 12. Further, this embodiment is advantageous in that the carrier frame 12 can be easily reused.

It should be understood by those skilled in the art that the foregoing description relates to only a preferred embodiment of the disclosed invention, and that various changes and modifications may be made to the invention without departing from the spirit and scope thereof.

We claim:

1. A method for manufacturing one side resin sealing type semiconductor devices comprising:

supporting a plurality of individual circuit boards, each having first and second surfaces thereof provided with first and second wiring patterns respectively, on a carrier frame provided with a plurality of through-holes spaced from each other by a certain distance, so that said first surfaces of the circuit boards are disposed adjacent said respective through-holes and peripheral portions of said first surfaces of the circuit boards are in contact with said carrier frame; and mounting semiconductor elements on said respective first surfaces of the circuit boards and electrically connecting said semiconductor elements with said respective first wiring patterns;

sealing with resin said first surfaces of the circuit boards within areas defined by said through-holes; and connecting the second wiring patterns on the second surfaces of the circuit boards with external connecting terminals.

2. A method according to claim 1, further comprising a step of: reversing upper and lower sides of the carrier frame so as to seal said first surfaces of the circuit boards with resin and join said second wiring patterns with the external terminals, after the semiconductor elements are electrically connected with said first wiring patterns.

3. A method according to claim 1, further comprising a step of: reversing upper and lower sides of the carrier frame so as to join the second wiring patterns to the external terminals, after the first surfaces of the circuit boards are sealed with resin in the areas defined by the through-holes.

4. A method according to claim 1, wherein the first surfaces of the circuit boards are sealed with resin by means of resin coating.

5. The method according to claim 4, wherein the means of resin coating is resin forming.

6. The method according to claim 4, wherein the means of resin coating is resin potting.

7. A method according to claim 1, said sealing step comprising: pouring resin for sealing the semiconductor element into a groove extending from the through-hole formed in the carrier frame to a portion where a side of the circuit board is located, on a surface of the carrier frame with which the circuit board comes into contact, so that the side of the circuit board is sealed with resin simultaneously when the first surface of the circuit board, on which the semiconductor element is mounted, is sealed.

8. A method according to claim 1, wherein a resilient layer is provided at least in a portion of a periphery of the through-holes with which the circuit boards come into contact.

9. A method according to claim 1, wherein said carrier frame includes an adhesive layer provided in a portion of the periphery of the through-holes with which the circuit boards come into contact.

10. A method according to claim 1, wherein said carrier frame is made of a sheet member and a plurality of support means for the circuit boards are also formed from said sheet member when it is cut and raised, the support means including an engaging piece which comes into contact with a side of the circuit board for positioning the circuit board in the carrier frame and also including an engaging portion for pressing the circuit board against the carrier frame when the circuit board is interposed between the engaging portion and the engaging piece.

11. A method according to claim 10, wherein said engaging portion includes a rising piece portion at which the sheet member composing the carrier frame is cut and raised, and a pressing piece portion provided at an end of the rising piece portion when a pressing face is formed being inclined so that the pressing piece portion can press the circuit board.

12. A method according to claim 10, wherein a fore end of the engaging piece is formed to be open outwardly and a constricted portion is provided in the middle of the engaging piece so that the engaging piece can be engaged in accordance with the thickness of the circuit board.

13. A method according to claim 1, wherein said through-holes are formed at a plurality of predetermined regular intervals.

14. The method according to claim 1, wherein the external connecting terminals are solder balls.

15. A method for manufacturing one side resin sealing type semiconductor devices comprising:

supporting a plurality of individual circuit boards, each having first and second surfaces, thereof provided with first and second wiring patterns, respectively, on a carrier frame provided with a plurality of through-holes spaced from each other by a certain distance, so that said second surfaces of the circuit boards are disposed adjacent said respective through-holes and peripheral portions of said second surfaces of the circuit boards are in contact with said carrier frame; and mounting semiconductor elements on said respective first surfaces of the circuit boards and electrically connecting said semiconductor elements with said respective first wiring patterns;

sealing with resin said first surfaces of the circuit boards so as to cover at least semiconductor elements mounted thereon; and connecting the second wiring patterns on the second surfaces of the circuit boards with the external connecting terminals within areas defined by said through-holes.

16. A method according to claim 15, further comprising a step of: reversing upper and lower sides of the carrier frame so as to seal said first surfaces of the circuit boards with resin and join said second wiring patterns with the external terminals, after the semiconductor elements are electrically connected with the first wiring patterns.

17. A method according to claim 15, further comprising a step of: reversing upper and lower sides of the carrier frame so as to join the second wiring patterns to the external terminals, after the first surfaces of the circuit boards are sealed with resin.

18. A method according to claim 15, wherein the first surfaces of the circuit boards are sealed with resin by means of resin coating.

19. The method according to claim 18, wherein the means of resin coating is resin forming.

20. The method according to claim 18, wherein the means of resin coating is resin potting.

21. The method according to claim 15, wherein the external connecting terminals are solder balls.

* * * * *